US007078241B2

(12) United States Patent
Son et al.

(10) Patent No.: US 7,078,241 B2
(45) Date of Patent: Jul. 18, 2006

(54) METHODS OF FORMING FERROELECTRIC CAPACITORS USING SEPARATE POLISHING PROCESSES

(75) Inventors: Yoon-ho Son, Gyeonggi-do (KR); Sang-woo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 10/811,351

(22) Filed: Mar. 26, 2004

(65) Prior Publication Data

US 2004/0191930 A1 Sep. 30, 2004

(30) Foreign Application Priority Data

Mar. 27, 2003 (KR) ............... 10-2003-0019255

(51) Int. Cl.
*H01L 21/00* (2006.01)
(52) U.S. Cl. ............ 438/3; 257/E21.208; 257/E21.664
(58) Field of Classification Search ...................... 438/3
See application file for complete search history.

(56) References Cited

U.S. PATENT DOCUMENTS 5,990,507 A  11/1999  Mochizuki et al. ......... 257/295
6,069,081 A *  5/2000  Kelleher et al. ............ 438/692
2002/0068452 A1 *  6/2002  Homma et al. ............. 438/690
2003/0030084 A1 *  2/2003  Moise et al. ................ 257/295

FOREIGN PATENT DOCUMENTS

KR  2002-0002570  1/2002
KR  2003-0001217  1/2003

OTHER PUBLICATIONS

Notice to Submit a Response for Korean Patent Application No. 10-2003-0019255 dated Feb. 28, 2005.

* cited by examiner

*Primary Examiner*—Asok Kumar Sarkar
(74) *Attorney, Agent, or Firm*—Myers Bigel Sibley & Sajovec, PA

(57) ABSTRACT

Ferroelectric memory devices can be formed by polishing an insulating layer on a plurality of ferroelectric capacitors with a silica slurry to reduce a height of the insulating layer above a surface of the plurality of ferroelectric capacitors so that the surface remains covered by a portion of the insulating layer. The insulating layer can be further polished with a ceria slurry to further reduce the height of the insulating layer and to expose a polishing stop layer on the surface of the plurality of ferroelectric capacitors. Related devices are also disclosed.

8 Claims, 10 Drawing Sheets

FIG. 13A

| POSITIONS ON WAFER | EDGE OF CELL ARRAY REGION | CENTER OF CELL ARRAY REGION |
|---|---|---|
| CENTER | | |
| BOTTOM | | |

FIG. 13B (PRIOR ART)

| POSITIONS ON WAFER | EDGE OF CELL ARRAY REGION | CENTER OF CELL ARRAY REGION |
|---|---|---|
| CENTER | | |
| BOTTOM | | |

METHODS OF FORMING FERROELECTRIC CAPACITORS USING SEPARATE POLISHING PROCESSES

CROSS-REFERENCE TO RELATED APPLICATION AND CLAIM FOR PRIORITY

This application claims priority to Korean Patent Application No. 2003-19255, filed on Mar. 27, 2003, in the Korean Intellectual Property Office, the contents of which are incorporated herein by reference in its entirety.

FIELD OF THE INVENTION

The invention relates to integrated circuit devices and method of manufacturing the same. More specifically, the invention relates to ferroelectric memory devices and methods of manufacturing the same.

BACKGROUND

Ferroelectric random access memories (FRAMs) have attracted attention as nonvolatile low-power semiconductor memory devices. As semiconductor memory devices, such as FRAMs, have become more highly integrated, the size of memory cells therein have been reduced using increasingly finer design rules.

U.S. Pat. No. 5,990,507 discusses a method of manufacturing a highly integrated FRAM. In this method, a reflow process is performed on a metal interconnection layer, such as an aluminum layer, in order to form a multi-layered interconnection structure, in which multiple interconnections are electrically connected to one another through a via contact. However, if a reflow process is used to form a via contact for a cell in an FRAM, a spontaneous polarization characteristic of the ferroelectric layer may be degraded.

This potential degradation can be addressed using an etchback process. In particular, after forming a plurality of ferroelectric capacitors on a semiconductor substrate, gap regions between the ferroelectric capacitors are covered with an insulating layer and then planarized using the etchback, such as a dry etch. Thereafter, a local plate line is formed to directly contact the top surfaces of the plurality of capacitors. However, the etchback may remove different amounts of the insulating layer from different regions on a wafer. For example, in a cell array region of an FRAM, more of the insulating layer may be removed near a center of a cell block than at an edge thereof. Thus, a ferroelectric layer under an upper electrode may be exposed due to over-etching or, alternatively, the upper electrode may be not exposed because too little of the insulating layer is removed by the etchback.

SUMMARY

Embodiments according to the invention can provide ferroelectric memory devices using separate polishing processes. Pursuant to some of these embodiments, an insulating layer on a plurality of ferroelectric capacitors is polished with a silica slurry to reduce a height of the insulating layer above a surface of the plurality of ferroelectric capacitors so that the surface remains covered by a portion of the insulating layer. The insulating layer is further polished with a ceria slurry to further reduce the height of the insulating layer and to expose a polishing stop layer on the surface of the plurality of ferroelectric capacitors.

In some embodiments according to the invention, the polishing stop layer is removed with an etch-back process using RF sputtering to expose an upper electrode of the plurality of ferroelectric capacitors. In some embodiments according to the invention, polishing the insulating layer further with the ceria slurry includes polishing the insulating layer with the ceria slurry at a faster rate than polishing the insulating layer with the silica slurry.

In some embodiments according to the invention, the polishing stop layer is one of $Al_2O_3$, $TiO_2$, $Ta_2O_5$, $BaTiO_3$, $SrTiO_3$, $Bi_4Ti_3O_{12}$, and $PbTiO_3$. In some embodiments according to the invention, the polishing stop layer is one of $Si_3N_4$ and SiON.

In some embodiments according to the invention, the polishing stop layer is formed using plasma chemical vapor deposition. In some embodiments according to the invention, the insulating layer is one of undoped silicate glass, plasma enhanced oxide, high density plasma oxide, and phosphosilicate glass.

In further embodiments according to the invention, a plurality of ferroelectric capacitors are formed in a cell array region on a substrate. A barrier layer is formed to cover ferroelectric capacitors in the cell array region and on the peripheral circuit region. A polishing stop layer is formed on the cell array region and on the peripheral circuit region to cover the barrier layer. An insulating layer is formed on the cell array region and on the peripheral circuit region to cover the polishing stop layer. A portion of the insulating layer only in the cell array region is removed to provide a first insulating pattern having a height above a surface ferroelectric capacitors in the cell array region. The first insulating pattern in the cell array region and the peripheral circuit region is planarized using chemical mechanical polishing to form a planarized second insulating pattern that exposes the polishing stop layer. The exposed portion of the polishing stop layer and the barrier layer disposed thereunder are removed until the top surface of the ferroelectric capacitor is exposed.

In some embodiments according to the invention, the portion of the insulating layer only in the cell array region is selectively removed by an etchback process using RF sputtering.

In further embodiments according to the invention, a ferroelectric capacitor includes an oxide layer in a gap between adjacent ferroelectric memory capacitors on a substrate. A barrier layer is located on sidewalls of the adjacent ferroelectric memory capacitors. A polishing stop layer is located between the barrier layer and the oxide layer comprising a material having an etch selectivity with respect to a slurry used for polishing the oxide layer, the etch selectivity of the slurry for the polishing stop layer being lower than that of the oxide layer.

BRIEF DESCRIPTION OF THE DRAWINGS

FIG. 13A shows scanning electron microscope (SEM) photographs of a planarized oxide layer that fills gap regions between ferroelectric capacitors using a CMP process according to the invention.

FIG. 13B shows scanning electron microscope (SEM) photographs of a structure obtained using a conventional method.

DETAILED DESCRIPTION OF EMBODIMENTS ACCORDING TO THE INVENTION

Figure 1:
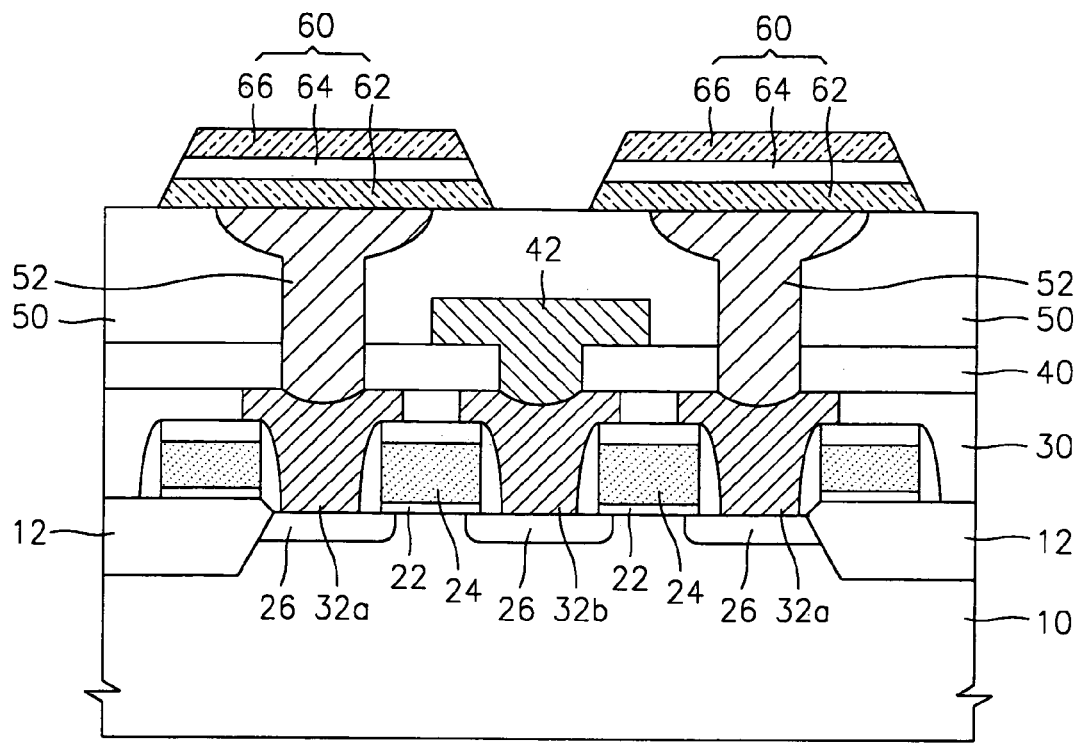
FIGS. 1 through 8 are cross-sectional views illustrating methods of forming ferroelectric memory devices according to some embodiments of the invention.

The invention is described hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the height of layers and regions are exaggerated for clarity. It will also be understood that when a layer is referred to as being "on" another layer or substrate, it can be directly on the other layer or substrate, or intervening layers may also be present. Like numbers refer to like elements throughout.

Furthermore, relative terms, such as "lower" and "upper", may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" of other elements would then be oriented on "upper" of the other elements. The exemplary term "lower", can therefore, encompass both an orientation of lower and upper, depending of the particular orientation of the figure.

It will be understood that although the terms first and second may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the invention. Like numbers refer to like elements throughout.

FIGS. 1 through 8 are cross-sectional views illustrating methods of manufacturing a ferroelectric memory device according to some embodiments of the invention. Referring to FIG. 1, an isolation region 12 is formed in a semiconductor substrate 10, thereby defining a plurality of active regions. A gate insulating layer 22, a gate electrode 24, and a source/drain region 26 are formed on the semiconductor substrate 10. A first interlayer dielectric (ILD) 30 is formed to cover the gate electrode 24 and patterned to form a pad contact hole. A conductive material is deposited in the pad contact hole by a known method, thereby forming a storage node pad 32a and a bit line pad 32b that are connected to the source/drain region 26. A second ILD 40 is formed on the resultant structure, where the storage node pad 32a and the bit line pad 32b are formed, and patterned to form a hole that exposes the bit line pad 32b. A conductive material is deposited in the hole, thereby forming a bit line 42.

A third ILD 50 is formed on the resultant structure including the bit line 42. The third ILD 50 and the second ILD 40 are sequentially patterned, thereby forming a storage node contact hole that exposes the storage node pad 32a. A conductive material is deposited in the storage node contact hole to form a contact plug 52.

A plurality of ferroelectric capacitors 60 are formed on the resultant structure including the contact plug 52. Each of the ferroelectric capacitors 60 includes a lower electrode 62, a ferroelectric layer 64, and an upper electrode 66, which are sequentially formed. The lower electrode 62 and the upper electrode 64 are formed of one of a heat-resistive metal, such as Pt, Ir, Ru, Rh, Os, and Pd, a conductive metal oxide, such as $IrO_2$, $RuO_2$, $(Ca, Sr)RuO_3$, and $LaSrCoO_3$, and any combination thereof. The ferroelectric layer 64 can be formed of one of $PZT(Pb(Zr, Ti)O_3)$, $BST((Ba, Sr)TiO_3)$, and $PLZT((Pb, La)(Zr, Ti)O_3)$.

Figure 2:
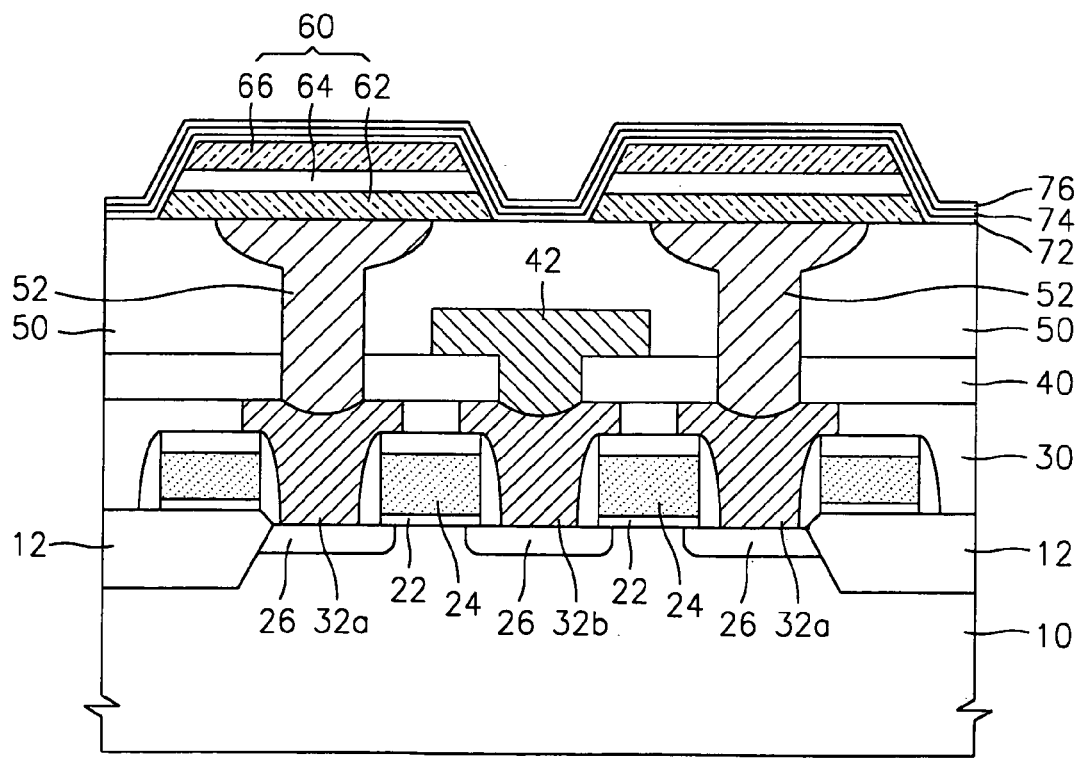

Referring to FIG. 2, a barrier layer 72 is formed on the entire surface of the resultant structure including the plurality of ferroelectric capacitors 60. The barrier layer 72 is deposited to uniformly cover a top surface and sidewalls of the ferroelectric capacitor 60 and a top surface of the third ILD 50 that is exposed in a gap region between adjacent ferroelectric capacitors 60. The barrier layer 72 is formed to prevent or reduce penetration of hydrogen atoms into the ferroelectric layer 64 during a subsequent process of forming an oxide layer. For example, the barrier layer 72 is formed of one of $Al_2O_3$, $TiO_2$, $Ta_2O_5$, $BaTiO_3$, $SrTiO_3$, $Bi_4Ti_3O_{12}$, and $PbTiO_3$.

A polishing stop layer 74 is formed on the barrier layer 72. The polishing stop layer 74 functions as a polishing stop point during a subsequent process of planarizing an oxide layer. For example, the polishing stop layer 74 may be formed of $Si_3N_4$ or SiON. The polishing stop layer 74 may be formed using, for example, plasma Chemical Vapor Deposition (CVD) or Atomic Layer Deposition (ALD).

Before an oxide layer is formed on the polishing stop layer 74 during a subsequent process, a buffer layer 76 is formed on the polishing stop layer 74 to reduce dependency of the oxide layer upon the underlayer. The buffer layer 76 can be formed of $Al_2O_3$. The buffer layer 76, formed on the polishing stop layer 74, may improve an affinity of the oxide layer for the polishing stop layer 74. For example, the buffer layer 76 can provide a seed layer for forming a subsequent oxide layer. The buffer layer 76 may be formed of a different material according to the types of oxide layer to be formed on the polishing stop layer 74 or a formation process. In some embodiments according to the invention, the buffer layer 76 may be omitted.

Figure 3:
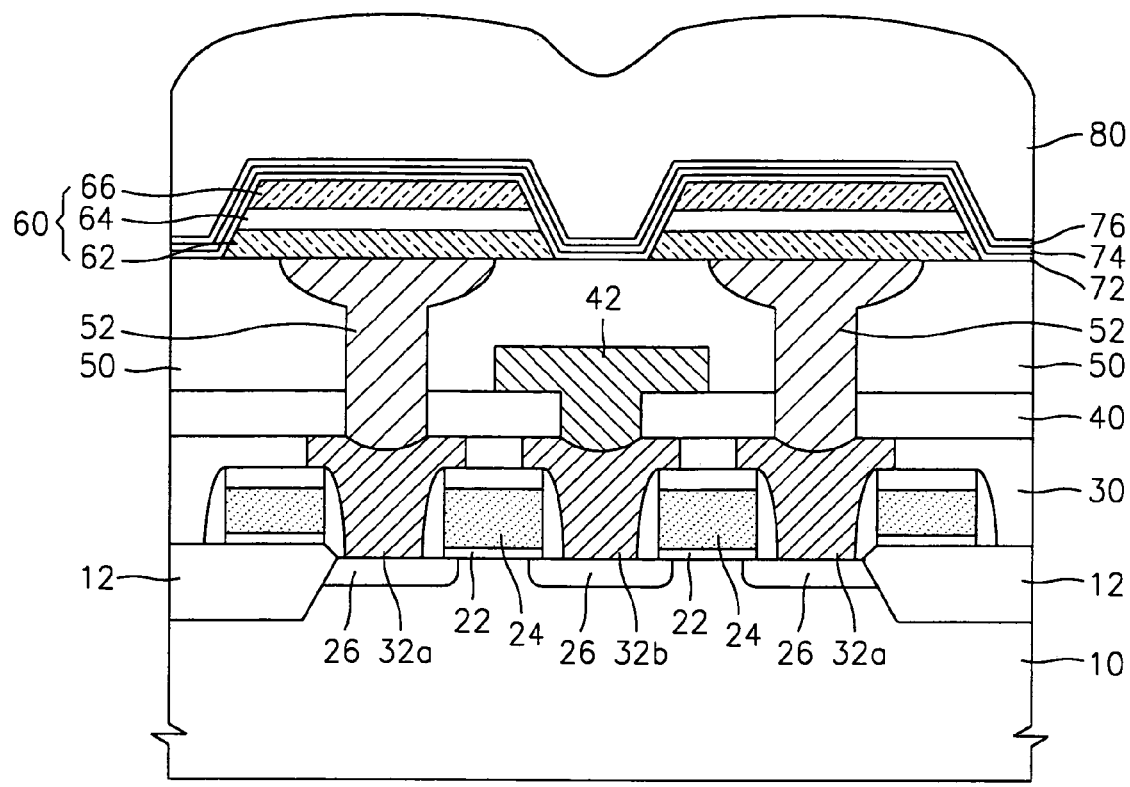

Referring to FIG. 3, an oxide layer 80 is formed on the buffer layer 76 to completely fill the gap region between adjacent ferroelectric capacitors 60. The oxide layer 80 is preferably formed of a material, which can reduce the generation of hydrogen, so as not to degrade a polarization characteristic of the ferroelectric layer 64 constituting the ferroelectric capacitor 60. The oxide layer 80 can be formed of one of undoped silicate glass (USG), plasma enhanced oxide (PEOX), high density plasma oxide (HDP oxide), and phosphosilicate glass (PSG).

The oxide layer 80 is planarized using CMP to form a planarized oxide pattern 80b (refer to FIG. 5) that exposes a portion of the polishing stop layer 74. In some embodiments according to the invention, the planarization of the oxide layer 80 is provided by a CMP process including a first polishing step (refer to FIG. 4) of using silica slurry and a second polishing step (refer to FIG. 5) of using ceria slurry. More specifically, a portion of the oxide layer 80 is polished using silica slurry to reduce the step difference of the surface of the oxide layer 80, thereby forming an oxide pattern 80a shown in FIG. 4.

Figure 5:
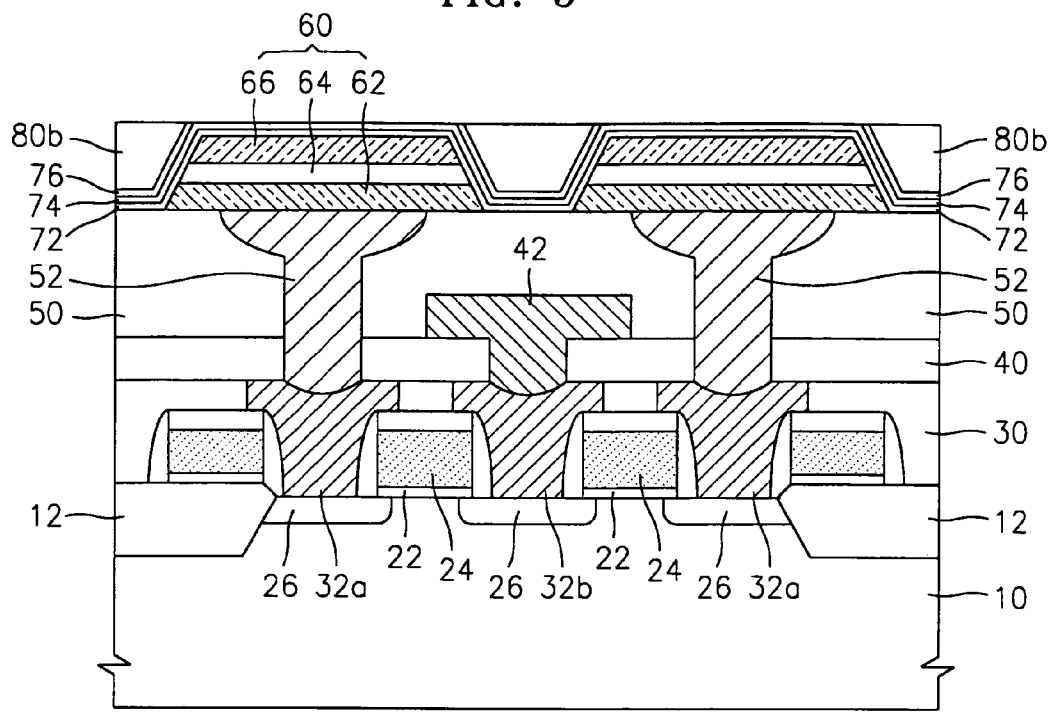

The oxide pattern 80a is polished using ceria slurry having an etch selectivity of oxide to nitride, which is greater than that of the silica slurry, thereby forming the planarized oxide pattern 80b shown in FIG. 5. The polishing stop layer 74, on the ferroelectric capacitor 60, is exposed by the planarization of the oxide pattern 80b. Since the ceria slurry polishes the oxide layer to a greater degree than the silica slurry, the planarized oxide pattern 80b obtained using the ceria slurry has a relatively flat surface across a large region of the wafer. Also, after CMP, the thickness deviation of the polishing stop layer 74 exposed through the planarized oxide pattern 80b may be improved. A difference in the height of the planarized oxide layer 80b and the polishing stop layer 74 may be reduced between an edge and a center of the cell array region of the wafer or between an edge and a center of each of a plurality of dies included in the cell array region.

Figure 6:
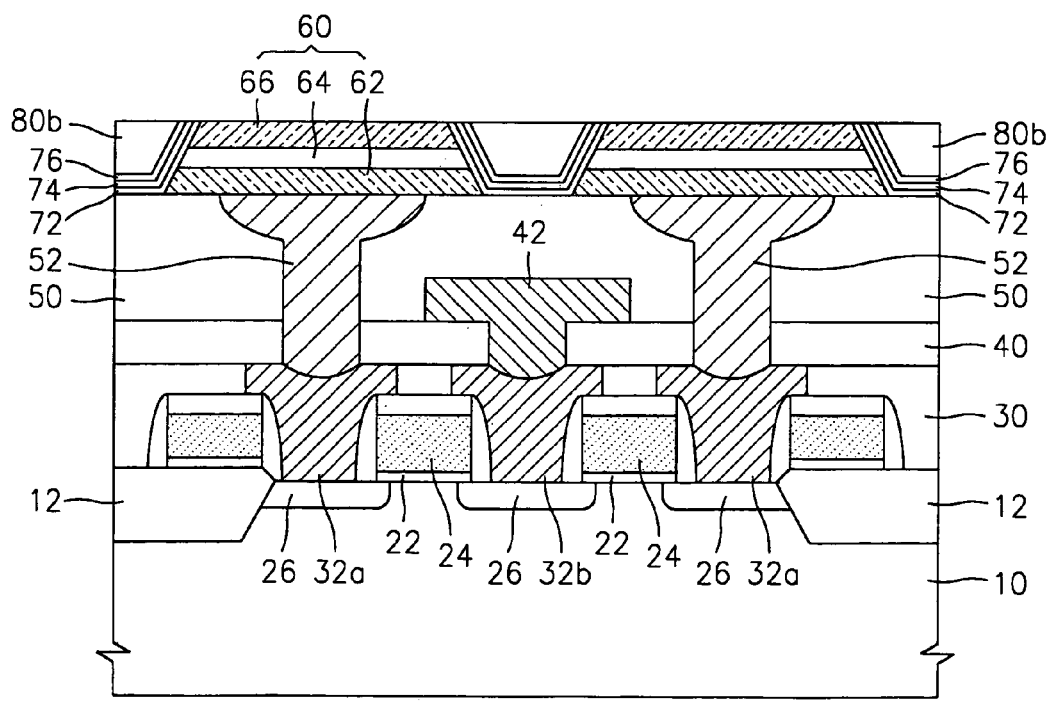

Referring to FIG. 6, the exposed portion of the polishing stop layer 74 and the barrier layer 72 thereunder are removed until the top surface of the upper electrode 66 of the ferroelectric capacitor is exposed using, for example, an etchback process carried out by RF sputtering using Ar gas. Once the top surface of the upper electrode 66 is exposed, the planarized oxide pattern 80b has the same level as the top surface of the upper electrode 66.

In some embodiments according to the invention, the exposed portion of the polishing stop layer 74 and the barrier layer 72 disposed thereunder are selectively removed using a wet etch process. In this case, the thickness of the planarized oxide pattern 80b remains unchanged.

Figure 7:
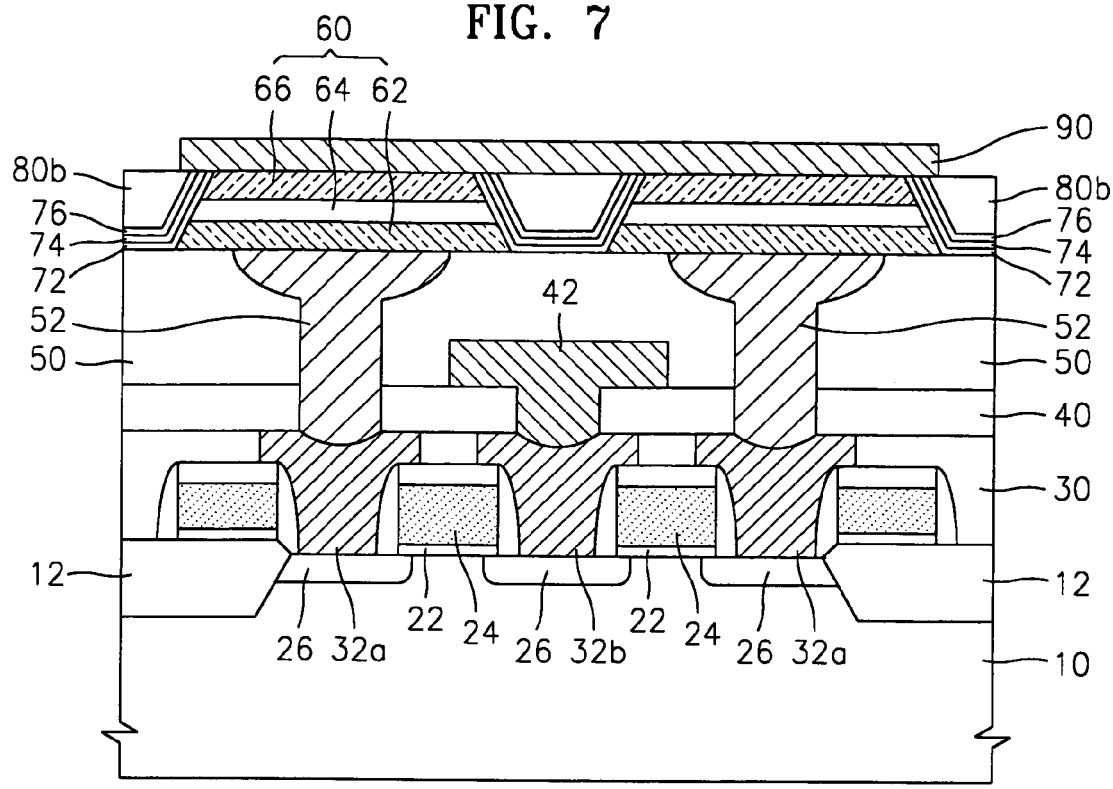

Referring to FIG. 7, a plurality of conductive patterns 90 are formed to directly contact the top surfaces of at least one pair of adjacent capacitors 60 among the plurality of ferroelectric capacitors 60. The conductive patterns 90 can be, for example, a metal, such as Al, Pt, Ti, Ir, and Ru, a conductive metal oxide, such as $IrO_2$, $RuO_2$, a conductive metal nitride, such as TiN and TiAlN, and any combination thereof and can provide a local plate line.

Figure 8:
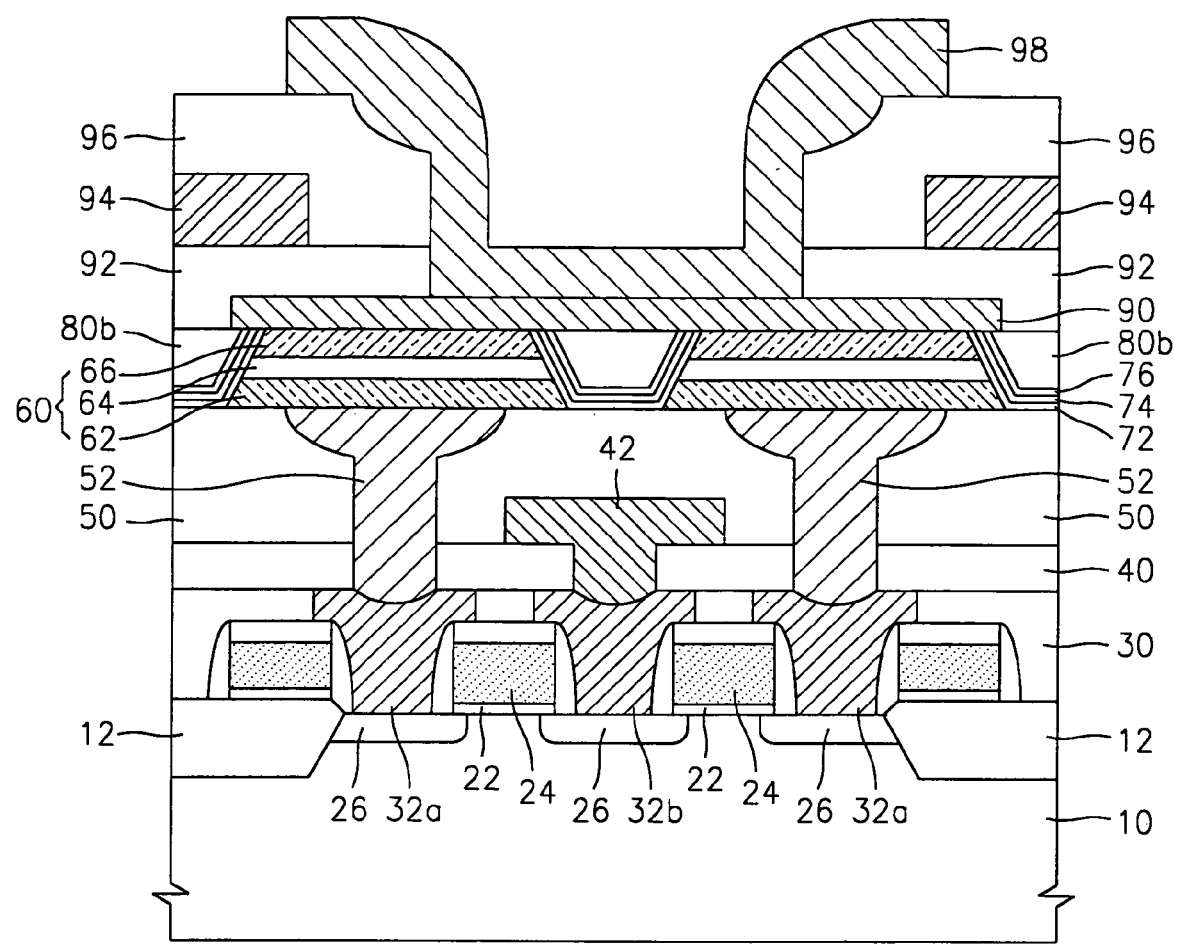

Referring to FIG. 8, a first upper ILD 92 is formed on the structure including the conductive pattern 90, and a first interconnection layer 94 is formed thereon to provide, for example, a main word line. A second upper ILD 96 is formed on the first interconnection layer 96. The second upper ILD 96 and the first upper ILD 92 are sequentially patterned, thereby forming a hole, which exposes a portion of the conductive pattern 90. A main plate line 98 is formed in the hole to contact the conductive pattern 90 and to electrically connect at least one pair of adjacent ferroelectric capacitors to the main plate line 98 via the conductive pattern 90.

FIGS. 9 through 12 are cross-sectional views illustrating methods of forming ferroelectric memory devices according to some embodiments of the invention. The embodiments illustrated by FIGS. 9–12 are generally similar to the embodiments illustrated in FIGS. 1–8, except that when an oxide layer 180 is planarized, different types of planarization processes are applied to a cell array region of a wafer and to the other regions in consideration of a pattern loading effect of the wafer. It will be further understood that, although only a peripheral circuit region is shown in FIGS. 9–12 as a region other than the cell array region, the following description should not be construed as being limited to the peripheral circuit region but similarly applies to all regions other than the cell array region.

Figure 9:
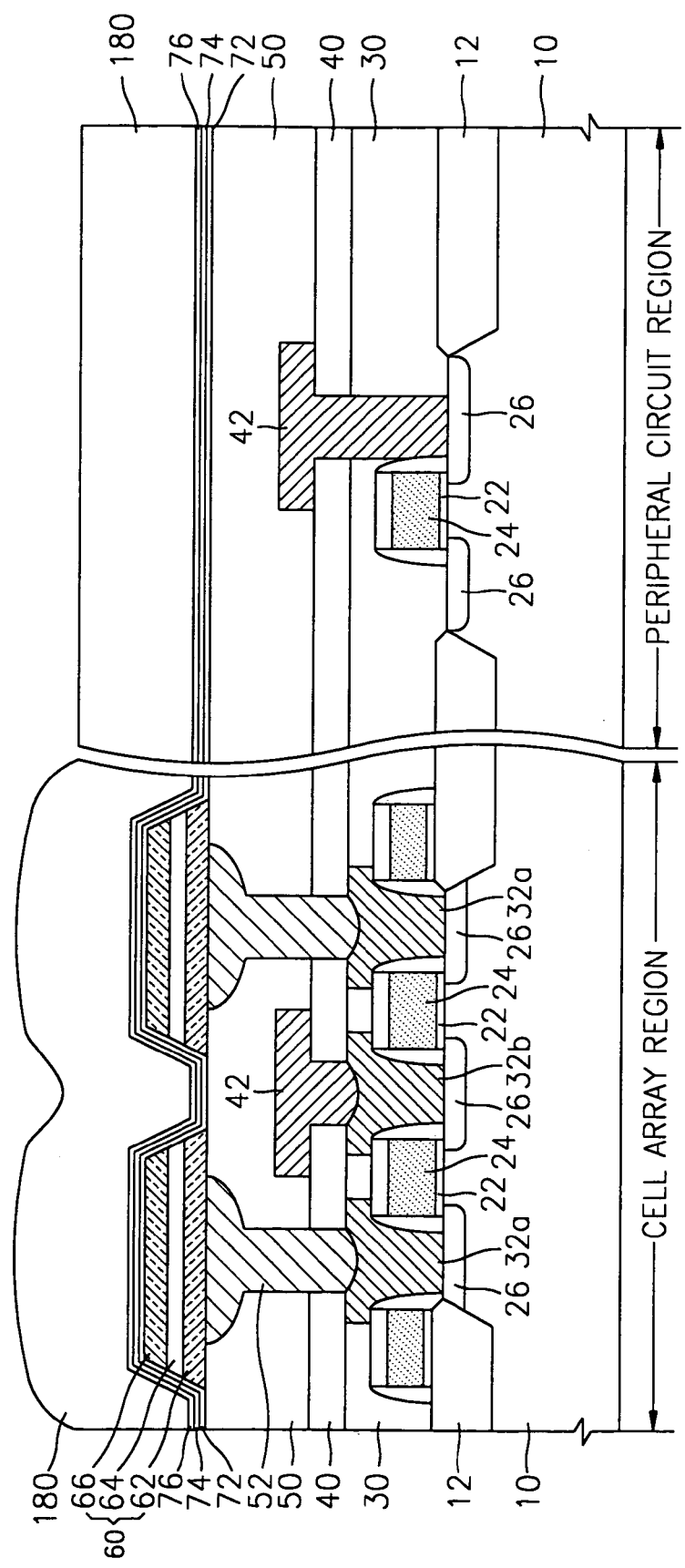
FIGS. 9 through 12 are cross-sectional views illustrating methods of forming ferroelectric memory devices according to some embodiments of the invention.

Referring to FIG. 9, the isolation regions 12 and the plurality of ferroelectric capacitors 60 may be formed in the same manner as described with reference to FIG. 1. The barrier layer 72, the polishing stop layer 74, and the buffer layer 76 are formed in each of the cell array region and a peripheral circuit region of the semiconductor substrate 10 may be formed in the same manner as described with reference to FIG. 2.

An insulating layer 180 is provided by forming an oxide layer on the buffer layer 76 in the same manner as described with reference to FIG. 3. As a result, a relatively large step difference exists between a height of the surface of the oxide layer 180 in the cell array region and a height of the surface of the oxide layer 180 in the peripheral circuit region.

It will be understood that the pattern density in the peripheral circuit region is less than in the cell array region. Thus, when the oxide layer 180 is planarized using CMP, the polishing rate in the cell array region may differ from that in the peripheral circuit region. Therefore, in some embodiments according to the invention, an etchback process is carried on a portion of the cell array region before the insulating layer 180 is polished using CMP. In other words, the etchback is used to polish only the portion of the cell array region, then the insulating layer 180 is polished using CMP.

Figure 10:
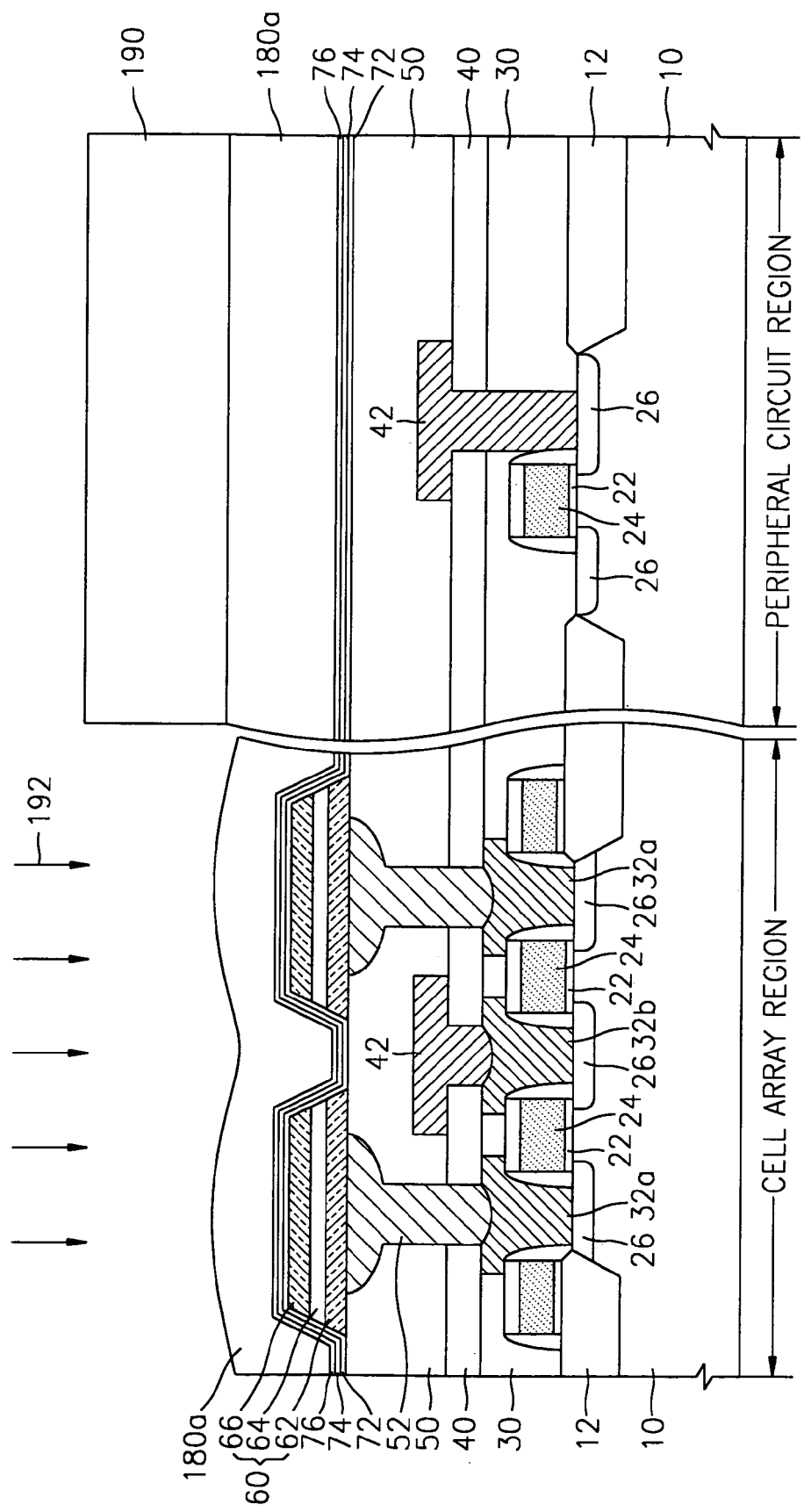

More specifically, referring to FIG. 10, a photoresist layer is deposited on the entire surface of the semiconductor substrate 10 including the insulating layer 180 and is then patterned to form a mask pattern 190, which exposes only the cell array region and covers the peripheral circuit region. Using the mask pattern 190 as a mask, a portion of the insulating layer 180 that is located only on the cell array region is selectively etched back by RF sputtering using Ar 192, thereby forming a first insulating pattern 180a having a height that is less than that of the peripheral circuit region covered by the mask.

Figure 4:
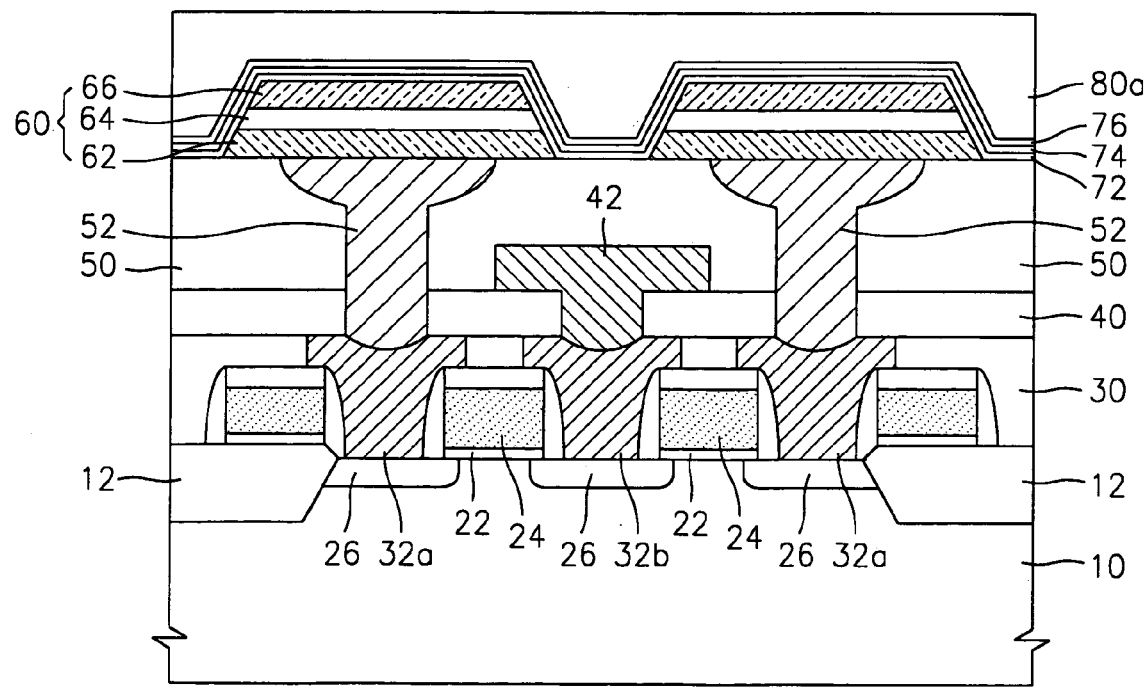
Figure 11:
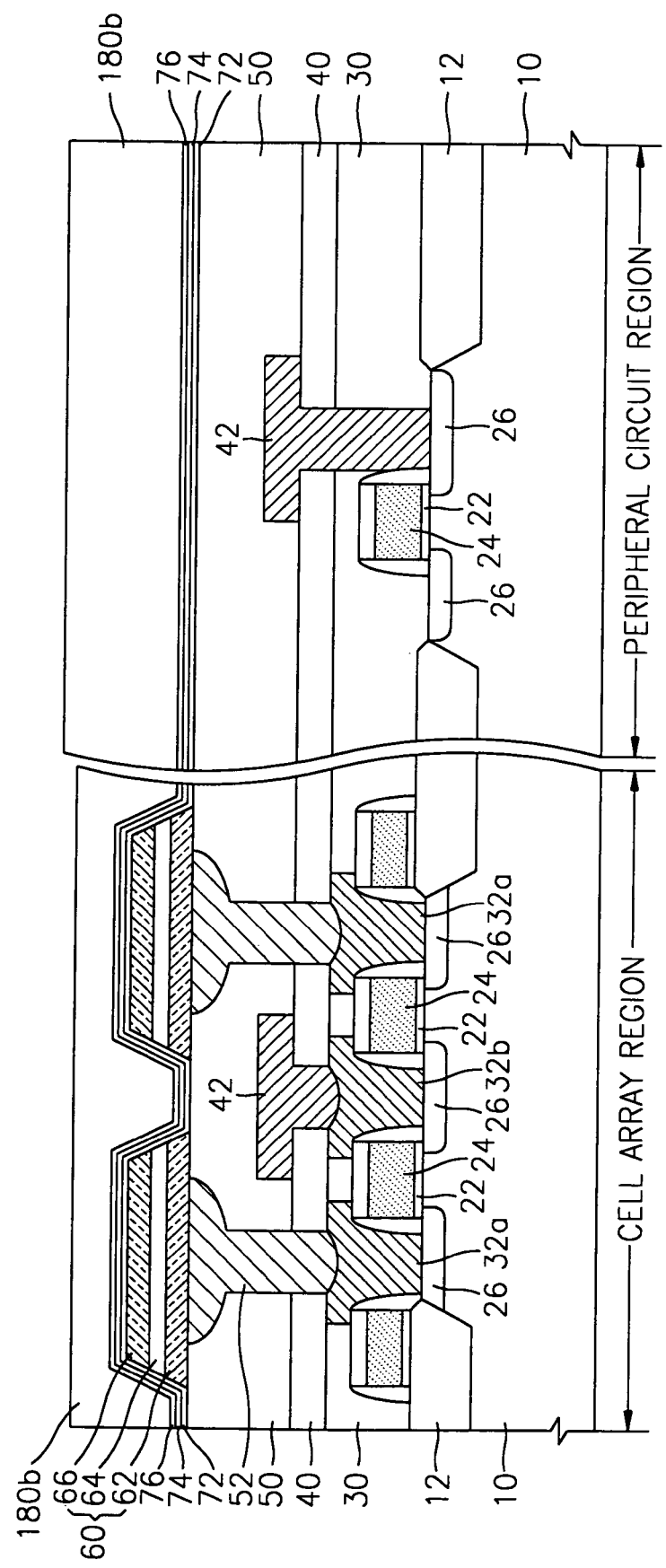

Referring to FIG. 11, the mask pattern 190 is removed and a portion of the first insulating pattern 180a is polished using silica slurry in the same manner as described with reference to FIG. 4, in order to reduce a step difference between the surface of the first insulating pattern 180a in the cell array region and the surface of the first insulating pattern 180a in the peripheral circuit region. Thus, an insulating pattern 180b having a low step difference between portions on the cell array region and on the peripheral circuit region can be formed.

Figure 12:
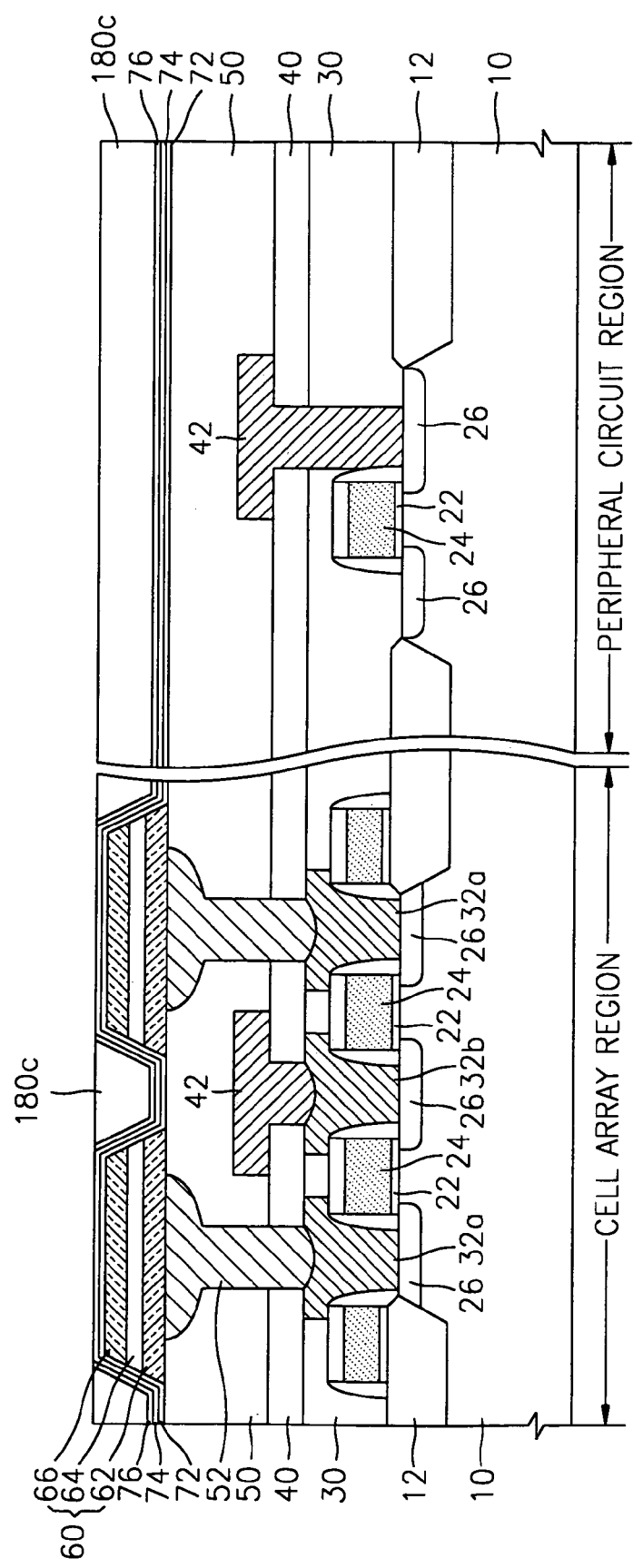

Referring to FIG. 12, the insulating pattern 180b is polished using ceria slurry in the same manner as described with reference to FIG. 5, thereby forming a planarized second insulating pattern 180c. As a result, the polishing stop layer 74, disposed on the ferroelectric capacitor 60, is exposed through the second insulating pattern 180c. According to some embodiments of the invention, the portion of the insulating layer 180 on the cell array region is etched back and then the insulating layer 180 is polished using CMP. After the CMP using the ceria slurry, the second insulating pattern 180c having an increased flatness may be obtained in all regions of a wafer with a reduced influence of pattern loading effect. Also, the thickness deviation of the polishing stop layer 74 exposed through the second insulating pattern 180c may be reduced.

Thereafter, the exposed portion of the polishing stop layer 74 and the barrier layer 72 disposed thereunder are removed until the top surface of the upper electrode 66 of the ferroelectric capacitor 60 is exposed. The processes described with reference to FIGS. 7 and 8 can be performed to complete a ferroelectric memory device.

FIG. 13A are scanning electron microscope (SEM) photographs showing cross-sections of structures obtained by planarizing an oxide layer filling gap regions between ferroelectric capacitors using a CMP process according to embodiments of the invention. In contrast, FIG. 13B are SEM photographs showing cross-sections of structures obtained using a conventional method.

To form a ferroelectric memory device according to the invention, an $Al_2O_3$ barrier layer, a SiON polishing stop layer, and an $Al_2O_3$ buffer layer were sequentially formed on a ferroelectric capacitor, and a USG layer was formed thereon to a sufficient thickness so as to fill a gap region between ferroelectric capacitors. Here, the thickness of the USG layer was adjusted such that the total thickness of ILDs formed on a bit line in a peripheral circuit region of a wafer was about 11000 Å.

A portion of the USG layer was polished using silica slurry until the total thickness of the ILDs formed on the bit line in the peripheral circuit region became about 1000 Å. Thereafter, the remaining USG layer was polished using ceria slurry until the SiON polishing stop layer formed on the ferroelectric capacitor was exposed. As a result, the total thickness of the ILDs remaining on the bit line in the peripheral circuit region was about 5000 Å. Then, the SiON polishing stop layer and the $Al_2O_3$ barrier layer were removed by RF sputtering using Ar until an upper electrode of the ferroelectric capacitor was exposed.

The section of the ferroelectric capacitor shown in FIG. 13A was taken in each of a center of a wafer and a bottom adjacent to a flat zone of the wafer. As shown in FIG. 13A, there is little difference in polished amount of the USG layer between the edge and the center in the cell array region, i.e., a more uniformly polished surface was obtained. Thus, problems such as failure to form electrical contact to the upper electrode, and exposure of the ferroelectric layer due to over-etching did not occur in the devices shown in FIG. 13A. Even if the polishing stop layer and the barrier layer were etched back using RF sputtering, erosive damage to the surface of the upper electrode was not observed.

In the conventional method shown in FIG. 13B, only an $Al_2O_3$ layer was formed on a ferroelectric capacitor, and a USG layer and an SOG layer were sequentially formed thereon to fill gap regions between ferroelectric capacitors. Next, the SOG layer and the USG layer were etched back using dry etching until an upper electrode of the ferroelectric capacitor was exposed. Thereafter, unnecessary materials remaining on the exposed upper electrode were removed using RF sputtering. In this case, when the section of the ferroelectric capacitor was taken in each of a center of a wafer and a bottom adjacent to a flat zone of the wafer. As shown in FIG. 13B, there was a larger difference between the polished amount of an oxide layer at the edge and at the center of the cell array region, and an etched amount of the oxide layer differed within a large range according to the positions on the wafer. Also, after the oxide layer was etched back, an upper electrode in the edge of the cell array region was excessively polished so as to expose a ferroelectric layer. Also, it can be seen that after the RF sputtering, the surface of the upper electrode was damaged by the conventional process.

In some embodiments according to the invention, a plurality of ferroelectric capacitors are formed on a substrate. An insulating layer is formed to fill gap regions between the ferroelectric capacitors. A polishing stop layer is formed on the ferroelectric capacitors and an oxide layer is formed thereon and then polished using a two-step CMP process. In particular, given a pattern loading effect, the insulating layer in a cell array region is planarized through both an etchback process using dry etching and a two-step CMP process. Therefore, by planarizing at a uniform polishing rate, a planarized insulating pattern may be provided across a wide range of regions of a wafer. Problems, such as erosive damage to the surface of the upper electrode, failure to open the upper electrode, exposure of a ferroelectric layer due to over-etching, and a local structural change of the ferroelectric layer can be effectively reduced or prevented.

While the invention has been particularly shown and described with reference to preferred embodiments thereof, it will be understood by those of ordinary skill in the art that various changes in form and details may be made therein without departing from the spirit and scope of the invention as defined by the following claims.

What is claimed:

1. A method of forming a ferroelectric memory device comprising:
    polishing an insulating layer on a plurality of ferroelectric capacitors with a silica slurry to reduce a height of the insulating layer above a surface of the plurality of ferroelectric capacitors so that the surface remains covered by a portion of the insulating layer;
    polishing the insulating layer further with a ceria slurry to further reduce the height of the insulating layer and to expose a polishing stop layer on the surface of the plurality of ferroelectric capacitors, wherein polishing an insulating layer on a plurality of ferroelectric capacitors with a silica slurry is preceded by:
    forming a mask that covers the insulating layer on a peripheral circuit region of the ferroelectric memory device and exposes the insulating layer on a cell array region of the ferroelectric memory device; and
    etching-back the insulating layer on the cell array region to a height that is less than a height of the insulating layer on peripheral circuit region, the method further comprising:
    polishing the insulating layer on the plurality of ferroelectric capacitors with the silica slurry to reduce the height of the insulating layer on the cell array region;
    removing the mask from the insulating layer on the peripheral circuit region; and
    polishing the insulating layer on the cell array region and on the peripheral circuit region with the ceria slurry to expose the polishing stop layer and to reduce a step difference between respective height of the insulating layer on the cell array region and on the peripheral circuit region.

2. A method of manufacturing a ferroelectric memory device, the method comprising:
    forming a plurality of ferroelectric capacitors in a cell array region on a substrate;
    forming a barrier layer to cover ferroelectric capacitors in the cell array region and on the peripheral circuit region;
    forming a polishing stop layer on the cell array region and on the peripheral circuit region to cover the barrier layer;
    forming an insulating layer on the cell array region and on the peripheral circuit region to cover the polishing stop layer;
    removing a portion of the insulating layer only in the cell array region to provide a first insulating pattern having a height above a surface ferroelectric capacitors in the cell array region;
    planarizing the first insulating pattern in the cell array region and the peripheral circuit region using chemical mechanical polishing to form a planarized second insulating pattern that exposes the polishing stop layer; and
    removing the exposed portion of the polishing stop layer and the barrier layer disposed thereunder until the top surface of the ferroelectric capacitor is exposed.

3. A method according to claim 2, wherein removing a portion of the insulating layer only in the cell array region comprises selectively removing the portion of the insulating layer only in the cell array region by an etchback process using RF sputtering.

4. A method according to claim 2 wherein the barrier layer comprises one of $Al_2O_3$, $TiO_2$, $Ta_2O_5$, $BaTiO_3$, $SrTiO_3$, $Bi_4Ti_3O_{12}$, and $PbTiO_3$.

5. A method according to claim 2 wherein the polishing stop layer comprises one of $Si_3N_4$ and SiON.

6. A method according to claim 2 wherein the insulating layer comprises one of undoped silicate glass, plasma enhanced oxide, high density plasma oxide, and phosphosilicate glass.

7. A method according to claim 2 wherein planarizing the first insulating pattern in the cell array region and the peripheral circuit region comprises polishing the oxide layer using ceria slurry.

8. A method according to claim 2 wherein planarizing the first insulating pattern in the cell array region and the peripheral circuit region using chemical mechanical polishing comprises polishing the insulating layer with the ceria slurry at a faster rate than polishing the insulating layer with the silica slurry.

* * * * *